US009923162B2

United States Patent
So et al.

(10) Patent No.: US 9,923,162 B2
(45) Date of Patent: Mar. 20, 2018

(54) BUCKLED ORGANIC LIGHT EMITTING DIODE FOR LIGHT EXTRACTION WITHOUT BLURRING

(71) Applicant: University of Florida Research Foundation, Inc., Gainesville, FL (US)

(72) Inventors: Franky So, Cary, NC (US); Wonhoe Koo, Gainesville, FL (US)

(73) Assignee: University of Florida Research Foundation, Incorporated, Gainesville, FL (US)

(*) Notice: Subject to any disclaimer, the term of this patent is extended or adjusted under 35 U.S.C. 154(b) by 0 days.

(21) Appl. No.: 14/766,722

(22) PCT Filed: Feb. 13, 2014

(86) PCT No.: PCT/US2014/016166
§ 371 (c)(1),
(2) Date: Aug. 7, 2015

(87) PCT Pub. No.: WO2014/127085
PCT Pub. Date: Aug. 21, 2014

(65) Prior Publication Data
US 2015/0372252 A1  Dec. 24, 2015

Related U.S. Application Data

(60) Provisional application No. 61/764,197, filed on Feb. 13, 2013.

(51) Int. Cl.
*H01L 51/52* (2006.01)
*H01L 51/00* (2006.01)
(Continued)

(52) U.S. Cl.
CPC ...... *H01L 51/5209* (2013.01); *H01L 51/0096* (2013.01); *H01L 51/5012* (2013.01);
(Continued)

(58) Field of Classification Search
CPC ............... H01L 51/00096; H01L 51/56; H01L 51/5209; H01L 51/5012; H01L 51/5215;
(Continued)

(56) References Cited

U.S. PATENT DOCUMENTS 8,217,381 B2 *   7/2012  Rogers ............... H01L 21/8258
                                                           257/40
8,853,724 B2 *  10/2014  Seo .................... H01L 51/5275
                                                           257/98
(Continued)

FOREIGN PATENT DOCUMENTS

EP   2 384 086 A1   11/2011
EP   2 495 783 A1    9/2012
(Continued)

OTHER PUBLICATIONS

U.S. Appl. No. 14/410,966, filed Dec. 23, 2014, So et al.
(Continued)

*Primary Examiner* — Christine Enad
(74) *Attorney, Agent, or Firm* — Wolf, Greenfield & Sacks, P.C.

(57) ABSTRACT

A layered organic light emitting diode (OLED) device comprises a buckled structure over a portion of the light emitting face to provide improved light output relative to flat OLED devices. The buckled structure has a fine buckling and a gross buckling, which are quasi-periodic. Embodiments of the invention are directed to a method of producing the OLED device comprising a buckled structure, where a transparent substrate coated with a transparent elastomeric layer has a thin metal layer deposited on a portion of the elastomeric layer at an elevated temperature. Upon cooling the metal layer buckles with the formation of the quasi-periodic buckling. Subsequently the metal layer is oxidized to a metal oxide layer that retains the buckling. An OLED with a buckling structure over a portion of the emitting face
(Continued)

is constructed on the metal oxide layer and retains the buckling of the metal oxide layer.

15 Claims, 3 Drawing Sheets

(51) Int. Cl.
      *H01L 51/50*       (2006.01)
      *H01L 51/56*       (2006.01)

(52) U.S. Cl.
    CPC ...... *H01L 51/5215* (2013.01); *H01L 51/5275* (2013.01); *H01L 51/56* (2013.01); *H01L 51/5056* (2013.01); *H01L 51/5221* (2013.01); *H01L 51/5225* (2013.01)

(58) Field of Classification Search
    CPC ............. H01L 51/5275; H01L 51/5056; H01L 51/5221; H01L 51/5225
    See application file for complete search history.

(56) References Cited

U.S. PATENT DOCUMENTS

| | | | |
|---|---|---|---|
| 2010/0019664 A1* | 1/2010 | Mishima | H01L 51/5268 313/504 |
| 2010/0059863 A1 | 3/2010 | Rogers et al. | |
| 2012/0061707 A1* | 3/2012 | Seo | H01L 51/5275 257/98 |
| 2012/0132897 A1* | 5/2012 | Seki | G02B 5/1809 257/40 |
| 2014/0306213 A1* | 10/2014 | Sato | H01L 51/5275 257/40 |
| 2016/0233447 A1* | 8/2016 | Kim | A61B 5/6826 |

FOREIGN PATENT DOCUMENTS

| | | |
|---|---|---|
| KR | 2011-0087433 A | 8/2011 |
| KR | 2011-0133376 A | 12/2011 |

OTHER PUBLICATIONS

PCT/US2013/047562, dated Dec. 16, 2013, International Search Report and Written Opinion.
PCT/US2013/047562, dated Jan. 8, 2015, International Preliminary Report on Patentability.
PCT/US2014/016166, dated May 28, 2014, International Search Report and Written Opinion.
PCT/US2014/016166, dated Aug. 27, 2015, International Preliminary Report on Patentability.
International Search Report and Written Opinion dated Dec. 16, 2013 in connection with Application No. PCT/US2013/047562.
International Preliminary Report on Patentability dated Jan. 8, 2015 in connection with Application No. PCT/US2013/047562.
International Search Report and Written Opinion dated May 28, 2014 in connection with Application No. PCT/US2014/016166.
International Preliminary Report on Patentability dated Aug. 27, 2015 in connection with Application No. PCT/US2014/016166.
Bowden et al., Spontaneous formation of ordered structures in thin films of metals supported on an elastomeric polymer. Nature. May 1998;393:146-149.
Jiang et al., Mechanics of precisely controlled thin film buckling on elastomeric substrate. Appl Phys Lett. Mar. 26, 2007;90(13):133119.
Khang et al., A stretchable form of single-crystal silicon for high-performance electronics on rubber substrates. Science. Jan. 13, 2006;311(5758):208-12. Epub Dec. 15, 2005.
Koo et al., Light extraction from organic light-emitting diodes enhanced by spontaneously formed buckles. Nature Photonics. Feb. 2010;4:222-226.
Yin, Enhancement of light extraction from organic light emitting diodes by direct fabrication on buckling structure substrates. University of Florida Graduate Thesis. 2012: 72 pages.
Yu et al., Tunable optical gratings based on buckled nanoscale thin films on transparent elastomeric substrates. Appl Phys Lett. Jan. 25, 2010;96(4):041111.

* cited by examiner

BUCKLED ORGANIC LIGHT EMITTING DIODE FOR LIGHT EXTRACTION WITHOUT BLURRING

RELATED APPLICATIONS

The present application is a U.S. National Stage application under 37 U.S.C. § 371 based on International Application No. PCT/US2014/016166, filed Feb. 13, 2014, which claims priority under 35 U.S.C. § 119(e) to U.S. Provisional Application Ser. No. 61/764,197, filed Feb. 13, 2013, each of which is hereby incorporated by reference herein in its entirety, including any figures, tables, or drawings.

BACKGROUND OF INVENTION

Organic light emitting diodes (OLEDs) suffer from a relatively low efficiency of emitted light relative to that generated because of light trapping due to a refractive index mismatch between the air (n=1), glass substrate (n=1.52), and an electrode/active layer, for example, an ITO/organic layer (~1.7 to ~2.0) in waveguide modes. The imposition of a periodic microstructure into an OLED permits the recovery of a portion of the lost light. Unfortunately, although improvement of the light output has occurred, the cost to achieve the periodic microstructure is that of complicating the process with lithographic and imprinting steps to prepare and transfer the microstructure to the OLED.

Bowden et al., Nature 1998, 393, 146-9 demonstrated the preparation of buckled structure by the deposition of metal films on a thermally expanded 1 cm thick polydimethylsiloxane (PDMS) rubber film, where upon subsequent cooling of the films, buckling of the metal film results from the compressive stress imposed by the cooling rubber where the buckles display a uniform wavelength of 20-50 micrometers. The buckles had periodicities between 20 and 50 µm; with a depth from the crest to the trough of 1.5 µm for metal deposition performed without external heating, where the temperature imposed by the hot evaporating metal appeared to result in a surface temperature of about 110° C., and depths of 3.9 µm for deposition conducted with external heating to 300° C. Regularly buckled semiconductor ribbons were disclosed by Khang et al., Science 2006, 311, 208-12 and Jiang et al., Applied Physics Letters 2007, 90, 133119, where a PDMS rubber is deformed along a single axis resulting in a periodically buckled semiconductor ribbon with periodic lengths in excess of a micron. Yu et al., Applied Physics Letters 2010, 96, 041111 demonstrated regular buckled patterns with submicron periodicity by controlling the thickness of the metal films to about 10 nm on 1 mm thick PDMS rubber strips that were pre-stretched along one axis at a desired pre-strain.

Koo et al., Nature Photonics 2010, 4, 222-6 extended the use of buckled metal surfaces to the preparation of OLEDs. PDMS was cured at 100° C. and an aluminum layer was deposited on the rubber at a thickness of about 10 nm. Upon cooling, a quasi-periodic buckled surface formed and was used to mold a PDMS replica of the buckled surface, which is subsequently metallated with Al and used to form a UV cured resin replica of the PDMS replica, where the final resin replica is used as a master template. The template was used to form a second PDMS replica after Al deposition, followed by forming a second resin replica, which, upon removal of the PDMS replica, is UV-ozone treated and used as a substrate that is sputtered with an ITO glass to form an anode. Subsequently an OLED is formed upon deposition of a hole transport layer, a light emission-electron transport layer, an electron injection layer, and an Al cathode layer. This OLED had an enhancement of the emitted intensity of about 2.2 fold at 525 nm and about fourfold at 655 nm.

There remains a need to achieve a periodic or a quasi-periodic microstructure that does not require a significant departure from existing fabrication techniques of an OLED. Particularly desirable is a quasi-periodic structure where the observed efficiency of the light output is improved by the relationship of the emission wavelength to the polar angles and azimuthal angles of the quasi-periodic structure and in a manner where the light output is not blurred because of the buckled structure.

BRIEF SUMMARY

Embodiments of the invention are directed to organic light emitting diode (OLED) devices, designed to emit light through a transparent substrate that is bound to a transparent elastomeric layer where a portion thereof is covered with a transparent metal oxide layer that displays a quasi-periodic buckling. A transparent anode layer, an electroluminescent layer, and a cathode layer, are deposed over the elastomeric layer and the transparent metal oxide layer to form an OLED device with a quasi-periodic buckling that displays a fine buckling superimposed on a gross buckling over the portion of the emitting face with the metal oxide layer. The buckled portion increases the light extracted from the OLED relative to one absent the buckling structure but lacks blurring that occurs when the entire emitting face is over a buckled structure. The fine buckling has a quasi-periodicity of 100 to 700 nm and the gross buckling has a quasi-periodicity of 10 to 20 µm. The transparent substrate can be glass or other rigid structure and the elastomer can be polydimethylsiloxane (PDMS) or other transparent elastomer.

Other embodiments of the invention are directed to methods of preparing an OLED device that comprise steps to deposit a transparent elastomeric layer on a transparent substrate; depositing a metal layer of 5 to 100 nm on a portion of the transparent elastomeric layer, where the metal layer buckles upon cooling and is oxidized to a buckled metal oxide layer. Depositing a transparent anode layer, an electroluminescent layer, and a cathode layer on the buckled and non-buckled substrate forms the OLED, which displays improved light output without blur.

DETAILED DISCLOSURE

Figure 1:
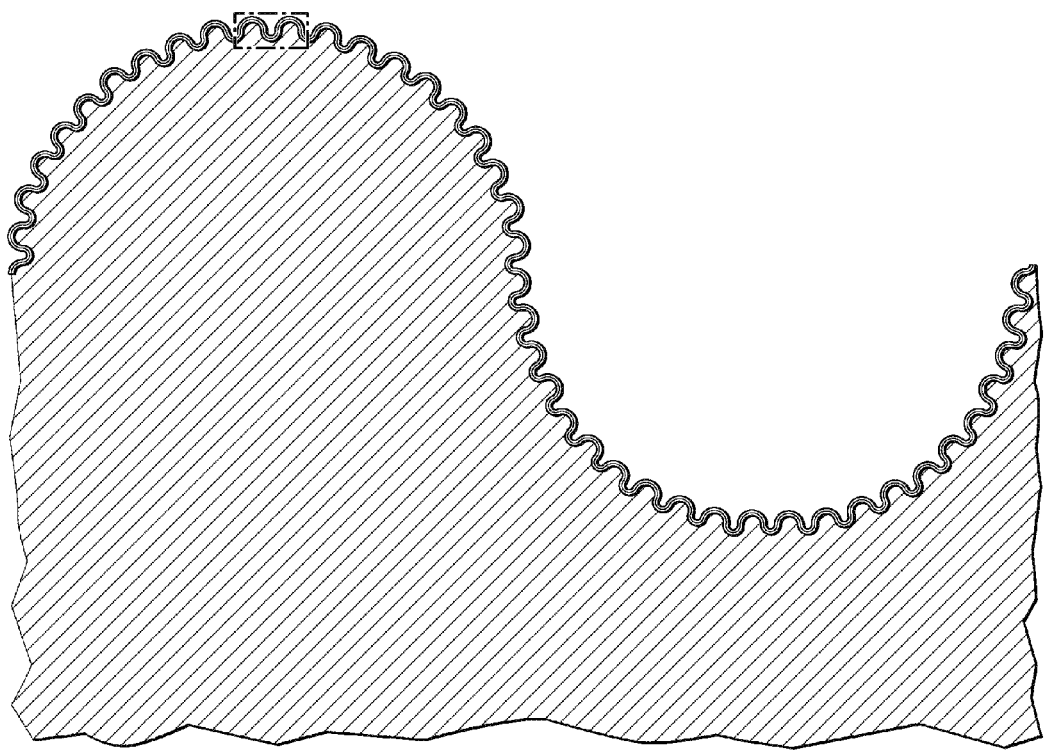
FIG. 1 shows a cross-section of the gross buckling structure of an organic light emitting diode (OLED) device with a quasi-periodic grating comprising the fine buckling shown by the boxed region, and shown in FIG. 2, on a gross buckling that extends for only a portion of the emitting area of the OLED, according to an embodiment of the invention.

Embodiments of the invention are directed to an organic light emitting diode (OLED) comprising a quasi-periodic grating that has a buckling structure that occupies a portion of the emitting area that is less than the entire emitting area. In an embodiment of the invention, the buckling comprises a fine buckling upon a gross buckling. The buckling is on a surface distal to the light exiting face where a transparent elastomer layer is adjacent to a transparent substrate at the light exiting face of the OLED. The buckled structure does not cover the entire area of the OLED light emitting area, where the outer portions of the light emitting area do not have a buckling topography on the distal face. The fine buckling structure is of dimensions that extract the waveguide modes of the OLED and have periodicities or quasi-periodicities of about 100 to about 700 nm. The gross buckling has a periodicity or quasi-periodicities of about 10 to 20 μm. The quasi-periodic buckling, of approximately the same periodicity, extends for a finite distance along any line parallel to the substrate for a few periods. For example, the buckling can extend for one to six periods and then a change of orientation of the buckling occurs as one traverses along any maximum or minimum feature of the buckling or any other cross-section of the fine buckling. The gross periodicity upon which is a fine periodicity of the buckled metal oxide on a substrate, is illustrated in FIG. 1, where the box on the top surface indicates the fine periodicity, and is shown in FIG. 2 as this magnified section.

Figure 2:
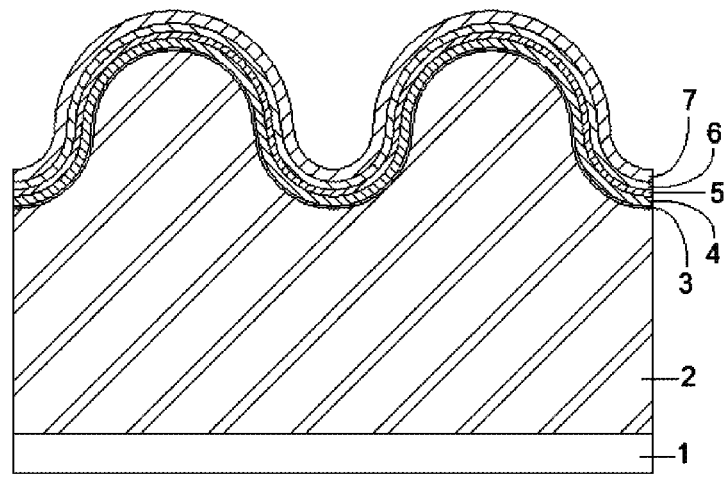
FIG. 2 shows a representation of a fine buckling structure, which exits on a gross buckling of the device that extends over a portion of the OLED, according to an embodiment of the invention.

According to an embodiment of the invention, a portion of the OLED has fine buckling, where a fine buckling is illustrated in FIG. 2. The illustrated OLED is a "bottom emission" device that includes a transparent (bottom) substrate 1 supporting a transparent elastomer layer 2, a transparent metal oxide layer 3, a transparent anode layer 4, optionally, a hole transporting layer 5, an electroluminescent layer 6, and a cathode layer 7. In an exemplary embodiment of the invention, the substrate 1 can be glass, the elastomer layer 2 can comprise silicone, the metal oxide layer 3 can comprise aluminum oxide, the anode 4 can comprise indium tin oxide (ITO), the hole transporting layer 5 can comprise N,N'-diphenyl-N,N'-bis(1-naphthyl)-(1,1'-biphenyl)-4,4'-diamine (NPB), the electroluminescent layer 6 can comprise tris-(8-hydroxyquinoline)aluminum ($Alq_3$), and the cathode layer 7 can comprise aluminum metal. According to an embodiment of the invention, the buckling portion is situated within the light emitting area of the OLED, but the portion does not extend to any edge of the light emitting area. The buckled portion can be from about 10 to about 90 percent of the light emitting area.

Another embodiment of the invention is directed to preparing an OLED device with improved light output. The method involves the formation of a transparent elastomer as a film on a transparent substrate. The transparent substrate can be a glass, or it can be a polymeric structure, such as a thermoplastic or a thermoset. The transparent substrate is capable of being warmed to at least 100° C. without distortion. The elastomer can be formed by cast as an elastomer precursor on the substrate followed by curing the precursor to the elastomer. The elastomer precursor can be spin coated, dip coated, doctor bladed, rolled, or deposited in any manner from a precursor in a liquid state, for example, a neat liquid precursor or a precursor in solution, optionally with a cross-linking agent and/or a catalyst. The elastomer can be an organic elastomer, for example, polybutadiene, polyisoprene, polychloroprene, poly(styrene-block-butadiene), poly(butadiene-co-acrylonitrile), poly(ethylene-co-propylene), poly(ethylene-co-propylene-co-butadiene, a polyacrylate or a fluoroelastomer. The elastomer can be an inorganic rubber, for example, silicone, fluorosilicone, or a polyphosphazine. The precursor to the elastomer can be monomeric, oligomeric, or polymeric and can be formed upon polymerization and/or crosslinking, which can be performed with the inclusion of a catalyst, initiator, or crosslinking agent, and can be gelled by heat or radiation. The deposited elastomer can be surface treated if desired; for example, the surface can be oxidized or treated with a functional agent to modify the surface in a manner that promotes adhesion to a metal coating. The elastomer can be deposited with a thickness of about 20 to about 1,000 μm or more in thickness.

Figure 3:
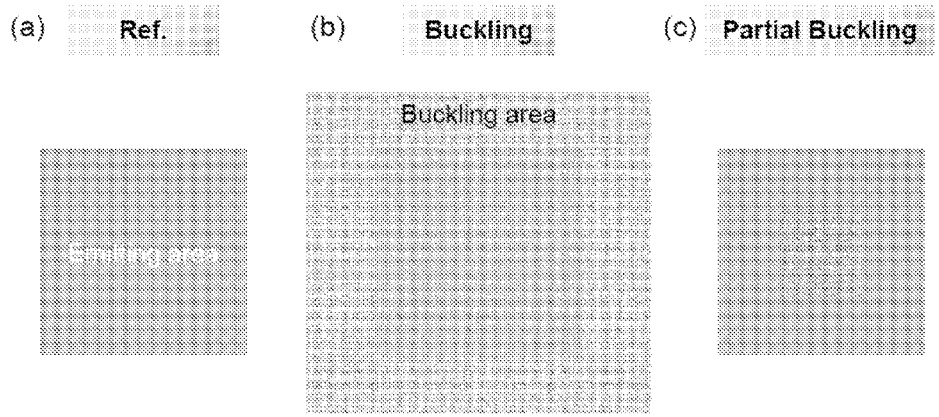
FIG. 3 shows illustrations of OLED emitting faces a) without buckling, b) with buckling over the entire emitting area, and c) with buckling inside the emitting area, according to an embodiment of the invention.

After deposition of the elastomer, a thin metal film can be deposited on the elastomeric film. The deposition can be carried out on the elastomer over a large range of temperatures above ambient temperature but below the decomposition temperature of the elastomer. The metal can be deposited as a film of about 5 nm to about 100 nm in thickness. In embodiments of the invention, a deposition mask can be employed to restrict the metal deposition, for example, an Al deposition on the elastomer, for example, PDMS. The metal deposition is limited to a portion of the area of the OLED on the substrate. After deposition of the metal film, the temperature is permitted to cool to ambient temperature upon which the adhered metal film is obliged to buckle due to the compressive stress imposed due to the large difference in the thermal expansion coefficients of the elastomer and the metal. The metal can be any metal that does not form a highly colored oxide. The metal can be, but is not restricted to, aluminum, magnesium, calcium, zinc, tin or cadmium. The metal can be an alloy, for example, zinc and aluminum, zinc and gallium, or tin and indium. This metal deposition ultimately has a buckling structure that is within and confined to a portion of the emitting area. FIG. 3 shows an OLED emitting face without buckling a), with buckling over the entire emitting area b), and with buckling structure being only a portion of the emitting area c).

The metal or metal alloy can be oxidized using an oxidizer, for example, ozone with ultraviolet radiation, and can be an oxidizing surface of a silicone rubber that has been treated with ozone and ultraviolet radiation. The metal oxide can be insulating, semiconducting or conducting. For example, the metal can be indium doped tin that forms an Indium tin oxide glass directly from the buckled metal. The quasi-periodicity of the buckling can be controlled by the thickness of the deposited metal layer. As the metal is deposited at an elevated temperature, for example, 80 to 200° C., the buckling occurs during the cooling of the elastomer.

Subsequent to the deposition of the metal and its conversion to the metal oxide, a transparent conductor can be deposited on the metal oxide. For example, a conductive metal oxide such as, but not restricted to, indium tin oxide, aluminum zinc oxide, gallium zinc oxide, or indium zinc oxide, can be deposited on the buckled metal oxide surface. In another embodiment of the invention, an ultrathin highly transmissive metal layer, for example, a 5 to 15 nm aluminum layer, can be deposited on the metal oxide. In another embodiment of the invention, an ultrathin metal layer, for example, a 2 to 5 nm layer, can be connected by a metal grid of thicker metal lines, for example, 100 to 1,000 nm lines spaced apart by 1 to 15 μm to form an electrode. The deposition can be conformal or non-conformal with the buckled metal oxide, although some degree of periodicity or quasi-periodicity is retained.

The hole transport layer can be selected from any appropriate material including, but not limited to: 1,1-bis[(di-4-tolylamino)phenyl]cyclohexane (TAPC); N,N'-diphenyl-N, N' (2-naphthyl)-(1,1'-phenyl)-4,4'-diamine (NPB); N,N'-diphenyl-N,N'-di(m-tolyl) benzidine (TPD); and poly[(9,9-dioctyl-fluorenyl-2,7-diyl)-alt-co-(9-hexyl-3,6-carbazole)] (PF-9HK). The light emitting layer can be selected from any appropriate material including, but not limited to: tris(2-phenylpyridine) iridium (Ir(ppy)3); poly-[2-methoxy, 5-(2'-ethyl-hexyloxy) phenylene vinylene] (MEH-PPV); tris(8-hydroxy quinoline) aluminum (Alq3); iridium (III) bis[(4,6-di-fluorophenyl)-pyridinate-N,C2']picolinate (FIrpic); oxadiazole pendant poly(phenylene vinylene); oligo(9,9-di-n-octylfluorene-2,7-vinylene); poly(4-4'-diphenylene diphenylvinylene) (PDPV); poly(9,9-dialkylfluorenes), poly(bis-acetylide thiophenes) with 2,1,3-benzothiadiazole (BTD) or quinoxaline; diphenyloxadiazole pendant polystyrene; 5,6,11,12-tetraphenylnaphthacene; bis(4',6'-Difluoro-phenylpyridinato)-4,9-bis-[4-(2,2-diphenyl-vinyl)-phenyl]-naphtho[2,3-c] [1,2,5]thiadiazole; 4,4'-bis'2,2'-diphenylvinyl'-1,1'-spirobiphenyl; and fac-tris(2-phenylpyridine) iridium [Ir(ppy)3] doped into a 4,4'-N,N'-dicarbazole-biphenyl. An additional electron transport layer can be inserted between the electroluminescent layer and the cathode, and can be selected from any appropriate material including, but not limited to: tris[3-(3-pyridyl)-mesityl]borane (3TPYMB); 2,9-Dimethyl-4,7-diphenyl-1,10-phenanthroline (BCP); 4,7-diphenyl-1,10-phenanthroline (BPhen); and tris(8-hydroxy quinoline) aluminum (Alq$_3$). The top cathode can be transparent or opaque, and can be a metal layer. For example, the cathode can be Aluminum (Al), Silver(Ag), Magnesium Silver (MgAg), Gold (Au), or ITO.

METHODS AND MATERIALS

Glass substrates were covered with polydimethylsiloxane (PDMS) (silicone) films by spin-coating followed by curing at ~100° C. for 2 hours. Al layers of different thickness were deposited to determine the peak periodicity of the buckle where buckles with quasi-periodicity ranged from dimensions of hundreds of nanometers to several tens of micrometers by changing the Al thickness from 10 nm to 100 nm. Ultra-violet ozone (UVO) treatment on the PDMS before the Al deposition also modifies the periodicity of the buckle. The smaller periodicities of the buckle, of several hundred nanometers, were found to be most efficient extraction of the waveguide mode in OLEDs. Al evaporated onto the portions of the PDMS film as determined by the deposition mask. The Al adatom chemically reacted with the PDMS layer, transforming the Al adatoms to the transparent aluminum oxide layer. This transparent and buckled aluminum oxide on a portion of the PDMS was used as a grating substrate for a portion of the light extraction in OLEDs, where the portion is separated from the edges of the OLED emitting face. The PDMS layer and the Al layer were UVO-treated for a long period to render the surface hard, fixing the buckled and non-buckled regions. Subsequent depositions of a 90 nm thick ITO anode layer, a 100 nm thick TAPC hole transport layer, a 30 nm thick CBP doped with 13% Ir(ppy)$_3$ organic emitting layer, a 40 nm thick Bphen electron transport layer, a 1.5 nm thick LiF electron injection layer, and a 75 nm thick Al cathode layer were carried out to form the OLED.

Figure 4:
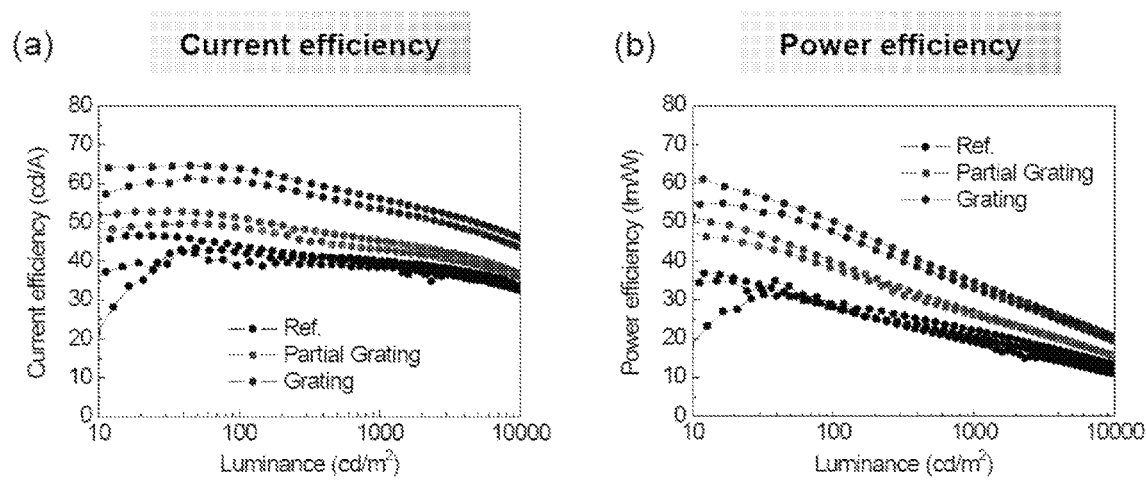
FIG. 4 shows plots of a) current efficiency (cd/A) and b) power efficiency (1 m/W) as a function of luminance (cd/m$^2$) for OLEDs without buckling (Reference), with buckling over the entire emitting area (Grating), and with buckling on a portion of the area inside the emitting area (Partial Grating), according to an embodiment of the invention.
Figure 5:
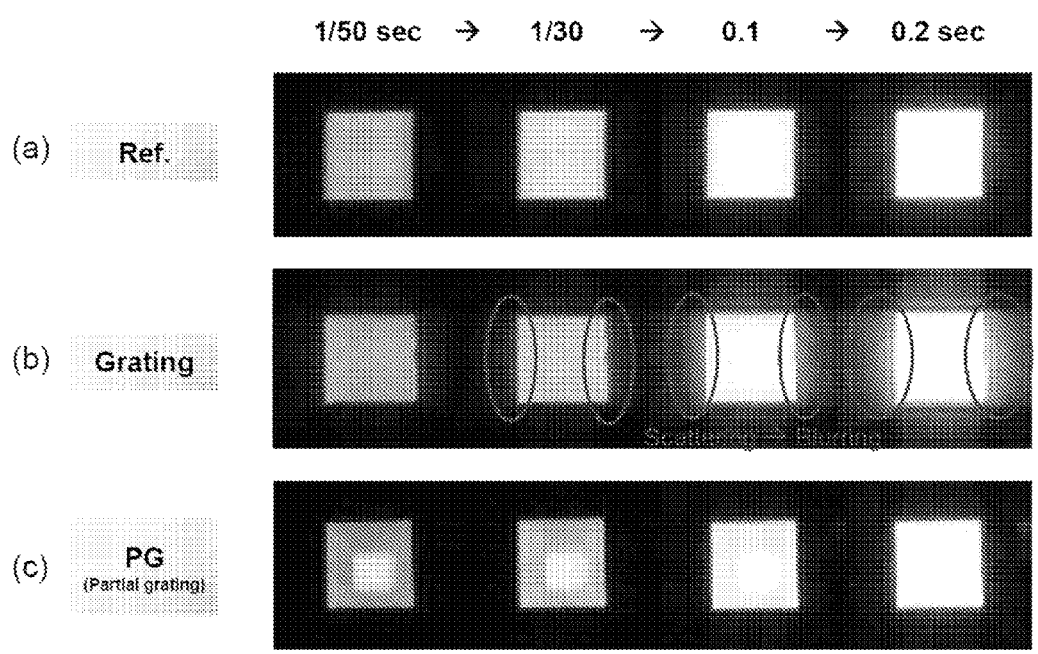
FIG. 5 shows photographic images with a range of exposure times of light emission from OLEDs without buckling (Reference), with buckling over the entire emitting area (Grating), and with buckling over a portion of the emitting area (Partial Grating), according to an embodiment of the invention.

OLEDs with and without buckling and the partial buckled area were tested for current efficiency as a function of luminance, as plotted in FIG. 4, where current versus luminance were measured with four devices with buckling and with four devices that do not exhibit buckling. As can be seen in FIG. 4, the average current efficiency without buckling is about 1.7 cd/A and the average efficiency with buckling is about 3.7 cd/A, which is a 120% enhancement due to the quasi-periodic surface extracting the waveguide mode. As can be seen in FIG. 5 for longer exposures, although the light intensity is less than that with buckling over the entire light emitting surface, the OLED with a portion that is buckled has improved light output relative to the flat OLED reference and lacks the blur displayed by the completely buckled light emitting face.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

We claim:

1. An organic light emitting diode (OLED) device, comprising a transparent substrate, a transparent elastomeric layer disposed between the transparent substrate and a transparent metal oxide layer over a portion of the transparent elastomer layer, wherein the metal oxide layer contacts an OLED comprising a transparent anode layer, an electroluminescent layer, and a cathode layer, wherein the OLED has a quasi-periodic buckling within the portion with the metal oxide layer, wherein the buckling has a fine buckling and a gross buckling, wherein the light exiting face of the OLED device is the transparent substrate.

2. The device of claim 1, wherein the portion with the metal oxide layer is over 10 to 90 percent of the light emitting face.

3. The device of claim 1, wherein the portion with the metal oxide layer is separated from any edge of the light emitting face by a portion of the OLED without the buckling.

4. The device of claim 1, wherein the fine buckling has a quasi-periodicity of 100 to 700 nm and the gross buckling has a quasi-periodicity of 10 to 20 μm.

5. The device of claim 1, wherein the transparent substrate is glass and the transparent elastomeric layer comprises polydimethylsiloxane (PDMS).

6. The device of claim 1, wherein the transparent anode comprises a conductive metal oxide glass, a transparent metal film of less than 20 nm or a transparent ultrathin metal film of less than 5 nm with a metal grid of spaced apart metal lines with a thickness greater than 20 nm.

7. The device of claim 1, further comprising a hole transport layer.

8. A method of preparing an OLED device comprising a transparent substrate, a transparent elastomeric layer disposed between the transparent substrate and a transparent metal oxide layer over a portion of the transparent elastomer layer, wherein the metal oxide layer contacts an OLED comprising a transparent anode layer, an electroluminescent layer, and a cathode layer, wherein the OLED has a quasi-periodic buckling within the portion with the metal oxide layer, wherein the buckling has a fine buckling and a gross buckling, wherein the light exiting face of the OLED device is the transparent substrate, the method comprising:
- providing a transparent substrate;
- depositing a transparent elastomeric layer on the transparent substrate;
- depositing a metal layer of 20 to 100 nm on a portion of the transparent elastomeric layer at an elevated temperature;
- reducing the temperature to an ambient temperature, wherein the metal layer buckles to form a buckled metal layer having a fine buckling and a gross buckling over the portion with the metal layer;
- oxidizing the buckled metal layer, wherein the buckled metal layer transforms into a buckled metal oxide layer;
- depositing a transparent anode layer;
- depositing an electroluminescent layer; and
- depositing a cathode layer, wherein a multilayer OLED is formed wherein the OLED has a quasi-periodic fine buckling and a quasi-periodic gross buckling over a portion of the emitting face of the MED.

9. The method of claim 8, wherein the substrate comprises a glass or a polymeric material.

10. The method of claim 8, wherein the transparent elastomeric layer is an organic rubber or an inorganic rubber.

11. The method of claim 10, wherein the inorganic rubber comprises polydimethylsiloxane (PDMS).

12. The method of claim 8, wherein the metal layer is aluminum.

13. The method of claim 8, wherein the transparent anode layer is a conductive metal oxide, a transparent metal film of less than 20 nm or a transparent ultrathin metal film of less than 5 nm with an metal grid of spaced apart metal lines with a thickness greater than 20 nm.

14. The method of claim 8, wherein the elevated temperature is at east 30° C. above the ambient temperature.

15. The method of claim 8, further comprising depositing a hole transport layer.

* * * * *

UNITED STATES PATENT AND TRADEMARK OFFICE
CERTIFICATE OF CORRECTION

PATENT NO. : 9,923,162 B2
APPLICATION NO. : 14/766722
DATED : March 20, 2018
INVENTOR(S) : So et al.

Page 1 of 1

It is certified that error appears in the above-identified patent and that said Letters Patent is hereby corrected as shown below:

In the Claims

Column 8
Line 2, "MED" should read --OLED--
Line 17, "east" should read --least--

Signed and Sealed this
Twenty-fourth Day of July, 2018

Andrei Iancu
*Director of the United States Patent and Trademark Office*